US008872689B2

(12) United States Patent
Mayer et al.

(10) Patent No.: US 8,872,689 B2
(45) Date of Patent: Oct. 28, 2014

(54) CIRCUIT ARRANGEMENT AND METHOD FOR OPERATING AN ANALOG-TO-DIGITAL CONVERTER

(71) Applicant: Infineon Technologies AG, Neubiberg (DE)

(72) Inventors: Alexander Mayer, Treffen (AT); Joachim Schnabel, Villach (AT)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 13/832,175

(22) Filed: Mar. 15, 2013

(65) Prior Publication Data

US 2014/0266841 A1   Sep. 18, 2014

(51) Int. Cl.
*H03M 1/12* (2006.01)
*H03M 1/00* (2006.01)
*H03M 1/34* (2006.01)

(52) U.S. Cl.
CPC ...... *H03M 1/34* (2013.01); *H03M 1/12* (2013.01); *H03M 1/001* (2013.01)
USPC ........................................... 341/155; 341/120

(58) Field of Classification Search
CPC .......... H03M 1/001; H03M 1/12; H03M 1/34
USPC ................................... 341/120, 155
See application file for complete search history.

(56) References Cited

U.S. PATENT DOCUMENTS 6,067,035 A * 5/2000 Kosak et al. .................. 341/120
2011/0291741 A1 12/2011 Mayer et al.

FOREIGN PATENT DOCUMENTS

DE   102011076651 A1   12/2011

* cited by examiner

*Primary Examiner* — Khai M Nguyen

(57) ABSTRACT

Circuit arrangement, including a first resistor, a second resistor, a current source and an analog-to-digital converter. The second resistor is thermally coupled to the first resistor. The current source is coupled to the second resistor. The analog-to-digital converter is configured to receive a first voltage measured via the first resistor as a voltage to be digitized, and is configured to receive a second voltage measured via the second resistor as a reference voltage of the analog-to-digital converter.

16 Claims, 4 Drawing Sheets

CIRCUIT ARRANGEMENT AND METHOD FOR OPERATING AN ANALOG-TO-DIGITAL CONVERTER

TECHNICAL FIELD

Various embodiments relate generally to a circuit arrangement and a method for operating an analog-to-digital converter.

BACKGROUND

Signals may be temperature dependent. If the temperature range is small, the change in signal caused by the change in temperature may be negligible. However, for a large temperature range or for signals with a high temperature sensitivity, the change in signal due to the change in temperature may prevent a precise measurement of the signal.

For example, metal shunt resistors may be used in integrated power semiconductor components. When connected in series to the load path of the power semiconductor component, the voltage drop across the shunt may be used as a current sense signal. The voltage drop may be measured and may be further processed, for example, in a current control circuit such as a current limiter, a current regulator, and the like. However, shunt metal resistors may have a significant temperature coefficient. Alloys have been developed that exhibit a temperature coefficient close to zero. However, such alloys cannot be processed in integrated circuits where mainly pure metals such as aluminum, copper and gold are processed to form metallization layers.

SUMMARY

In various embodiments, a circuit arrangement is provided, including a first resistor, a second resistor, a current source and an analog-to-digital converter. The second resistor may be thermally coupled to the first resistor. The current source may be coupled to the second resistor. The analog-to-digital converter may be configured to receive a first voltage measured via the first resistor as a voltage to be digitized, and may be configured to receive a second voltage measured via the second resistor as a reference voltage of the analog-to-digital converter.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
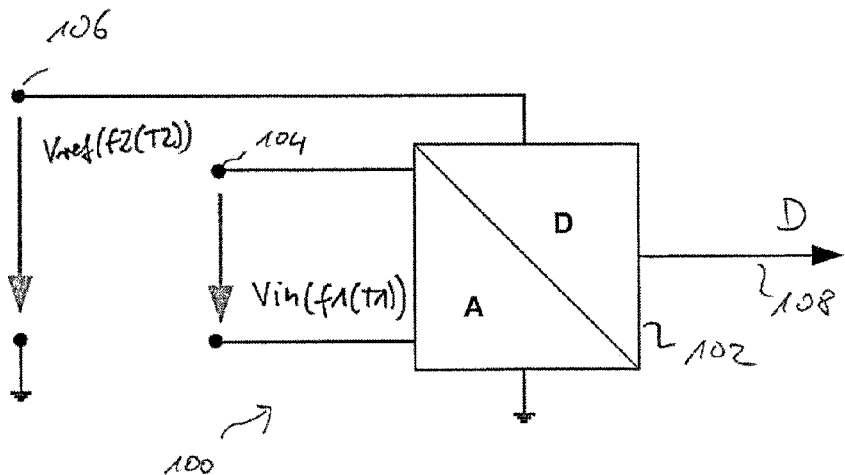
FIG. 1 shows a circuit arrangement in accordance with various embodiments.

FIG. 1 shows a circuit arrangement in accordance with various embodiments. The circuit arrangement 100 may have an analog-to-digital converter 102. The analog-to-digital converter 102 may have a first input 104. The first input 104 may receive an analog signal that is to be digitized by the analog-to-digital converter 102. The analog signal may be a voltage, in the following also referred to as a first voltage. The first voltage may be a temperature dependent voltage Vin. The temperature dependency of the first voltage Vin may be described or modeled or approximated by a function $f1(T1)$, where T1 may be the temperature at which Vin is measured and $f1(T1)$ may describe the temperature dependency of the first voltage Vin. The temperature dependency $f1(T1)$ may for example be linear over the temperature T1. The dependency of the first voltage Vin over the temperature T1 may be indicated by Vin ($f1(T1)$).

The analog-to-digital converter 102 may further have a second input 106. The second input 106 may receive a reference signal of the analog-to-digital converter 102. The reference signal may be a voltage, in the following also referred to as a second voltage. The second voltage may determine the maximum range of the first voltage that can be digitized. The second voltage may be divided into $2^N$ steps where N may be the number of bits of the analog-to-digital converter 102. It may be referred to as a reference voltage as the value of the first voltage may be determined as a number of steps into which the second voltage is divided, thus illustratively serving as a reference for the first voltage. The term reference voltage should not be confused with a supply voltage that may be necessary for operating the analog-to-digital converter 102 as an electronic component.

The second voltage may be a temperature dependent voltage Vref. The temperature dependency of the second voltage Vref may be described or modeled or approximated by a function $f2(T2)$, where T2 may be the temperature at which Vref is measured and $f2(T2)$ may describe the temperature dependency of the second voltage Vref. The temperature dependency $f2(T2)$ may for example be linear over the temperature T2. The dependence of the second voltage Vref over the temperature T2 may be indicated by Vref ($f2(T2)$).

The analog-to-digital converter 102 may have additional inputs, such as supply voltage inputs at which a supply voltage VDD may be applied for operating the analog-to-digital converter 102. It may have a gain input at which a gain signal may be applied. The gain G may be used to scale the analog signal that is to be digitized to the maximum range of the reference signal.

The analog-to-digital converter 102 may have an output 108. The output 108 may provide a digital signal D. The digital signal D may represent a digitization of the analog signal that is to be digitized. If the analog-to-digital converter 102 has N Bit, the digital signal D may be given by:

$$D = (G*Vin)/(Vref/2^N) \qquad (1)$$

Rearranging and using temperature dependent signals, the digital signal D may be given by:

$$D = G*2^N*(Vin(f1(T1))/Vref(f2(T2))) \qquad (2)$$

If the temperature dependencies f1 and f2 are equal or approximately equal and the temperatures T1 and T2 are equal or approximately equal, the digital signal D may be temperature independent or may have its temperature dependency reduced.

The temperatures T1 and T2 may be chosen to be equal or approximately equal through close thermal coupling. The temperature dependencies f1 and f2 may be chosen to be equal or approximately equal by generating the first voltage Vin and the second voltage Vref in the same or approximately the same way. The first voltage Vin and the second voltage Vref may be generated as voltage drops across the same type or approximately same type of resistors. The resistance of the resistors may have the same or approximately the same temperature dependency, for example, they may have the same or approximately the same temperature coefficient.

The above processes may be formulated as a method for operating an analog-to-digital converter. A first voltage is received by the analog-to-digital converter as a voltage to be digitized. A second voltage is received by the analog-to-digital converter as a reference voltage of the analog-to-digital converter. The first voltage and the second voltage may be chosen to have the same or approximately the same temperature dependency. Since the first voltage and the second voltage have the same or approximately the same temperature dependency the temperature dependency of a digital signal may be removed or reduced when digitizing the first voltage.

Figure 2:
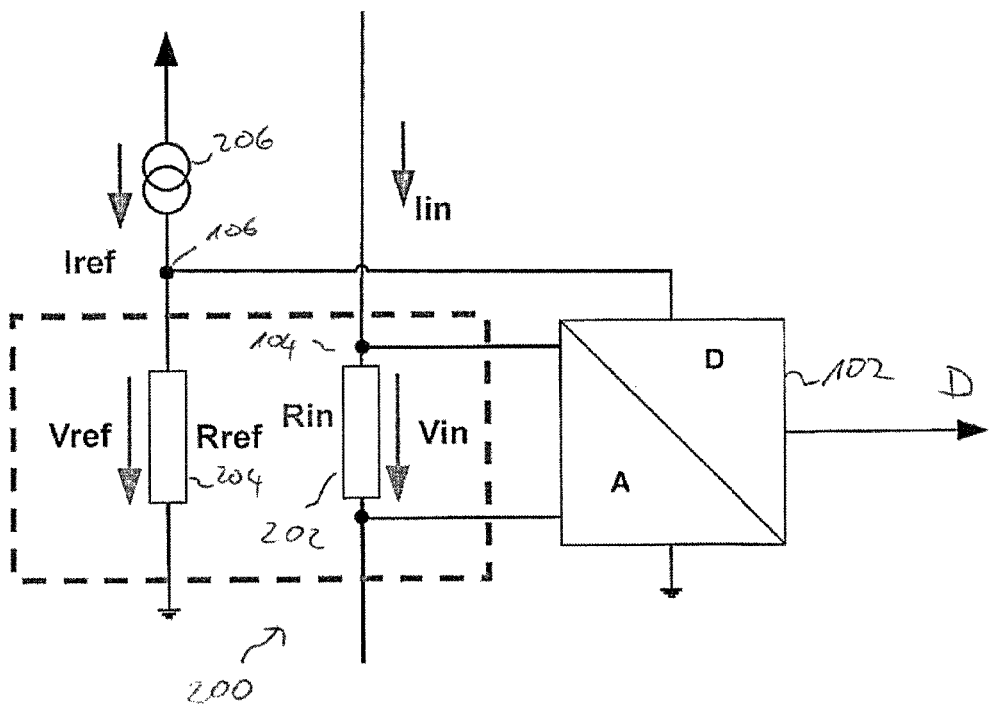
FIG. 2 shows a circuit arrangement in accordance with various embodiments.

FIG. 2 shows a circuit arrangement 200 in accordance with various embodiments. The circuit arrangement 200 may have an analog-digital-converter 102, a first resistor 202, a second resistor 204 and a current source 206.

The analog-to-digital converter 102 may be configured to receive a first voltage Vin measured via the first resistor 202 as a voltage to be digitized, and to receive a second voltage Vref measured via the second resistor 204 as a reference voltage of the analog-to-digital converter 102. The analog-to-digital converter 102 may correspond to and may be operated like the analog-to-digital converter 102 described in conjunction with FIG. 1.

The resistance Rin of the first resistor 202 may be in the range from about 10 milliohm to about 1 kiloohm, e.g. in the range from about 10 milliohm to about 10 ohm. It may, for example, be 50 milliohm. The first resistor 202 may be a shunt resistor. In the case of the using of low currents, the shunt resistance would increase and in this case, also a diffusion resistor (e.g. in silicon) may be provided. It may be used to measured a current Iin flowing through it via a voltage drop Vin across it:

$$Vin = Rin*Iin \qquad (3)$$

The voltage drop across the first resistor 202 may be the first voltage and may be coupled to the analog-digital-converter 102 to be converted into the digital value D.

The resistance Rref of the second resistor 204 may be in the range from about 1 ohm to about 1000 kiloohm, e.g. in the range from about 100 ohm to about 100 kiloohm. It may, for example, be 10 kiloohm. The resistance Rref of the second resistor 204 may be greater by at least a factor of 10 than the resistance Rin of the first resistor 202, e.g. greater by at least a factor of 100 than the resistance Rin of the first resistor 202, e.g. greater by at least a factor of 1000 than the resistance Rin of the first resistor 202. The second resistor 204 may provide a reference voltage Vref for the analog-digital-converter 102 via a reference current Iref flowing through it:

$$Vref = Rref*Iref \qquad (4)$$

The reference current Iref may be constant and may be provided by a current source 206. The current source 206 may be coupled to the second resistor 204. The current source 206 may provide a current Iref that is temperature independent or has a reduced temperature dependency. The current Iref may vary less than +/−5% over a temperature range, for example, over a temperature range from about −40° C. to about 450° C., e.g. over a temperature range from about −40° C. to about 200° C., or even higher, up to the technology maximum temperature). The variation may be further reduced by matching values of electronic devices in the current source, for example by using laser fuses or EEPROMs. The current source 206 may be provided by a bandgap circuit.

The resistance Rref and the current Iref may be chosen so that Vref is equal to or less than the maximum allowable input range of the analog-to-digital converter 102 at the first input 104. The reference voltage Vref may for example be chosen to never raise higher than a given voltage, for example 5V, 3.3 V or 1.2 V, over the whole temperature range.

The first resistor 202 and the second resistor 204 may be thermally coupled to each other. The thermal coupling is indicated in FIG. 2 by a dashed rectangle surrounding the first resistor 202 and the second resistor 204. The first resistor 202 and the second resistor 204 may then be at the same or approximately the same temperature. Their change in temperature may be the same or approximately the same. Thermal coupling may be achieved by placing the first resistor 202 and the second resistor 204 in proximity to each other. For example, the distance between the first resistor 202 and the second resistor 204 may be less than about 10 μm or less than about 5 μm.

The first resistor 202 and the second resistor 204 may have the same or approximately the same temperature dependency. Their temperature dependencies may be matched to each other. The change in the ratio of their resistances Rin to Rref over the entire temperature range, for example from about −40° C. to about 200° C., may be smaller than 1%. It may be less than 0.1%. The first resistor 202 and the second resistor 204 may have the same or approximately the same temperature coefficient. They may be made of the same material. The material may for example be copper, aluminum, gold or polysilicon. The first resistor 202 and the second resistor 204 may be produced in the same semiconductor production process.

Inserting equation (3) and (4) in equation (2) and rearranging, the digital signal D may be given by:

$$D = G*2^N*(Iin/Iref)*(Rin/Rref) \qquad (5)$$

Since Rin and Rref have the same or approximately the same change in resistance over temperature and current Iref is temperature independent or has a reduced temperature dependency, current Iin may be measured with a high accuracy over temperature. For example, current Iref may be measured with an accuracy of +/−10% over a temperature range from about −40° C. to about 200° C.

FIG. 3 to FIG. 7 show possible embodiments of the first resistor and the second resistor which may be used in the embodiments shown in FIG. 1 and FIG. 2.

Figure 3:
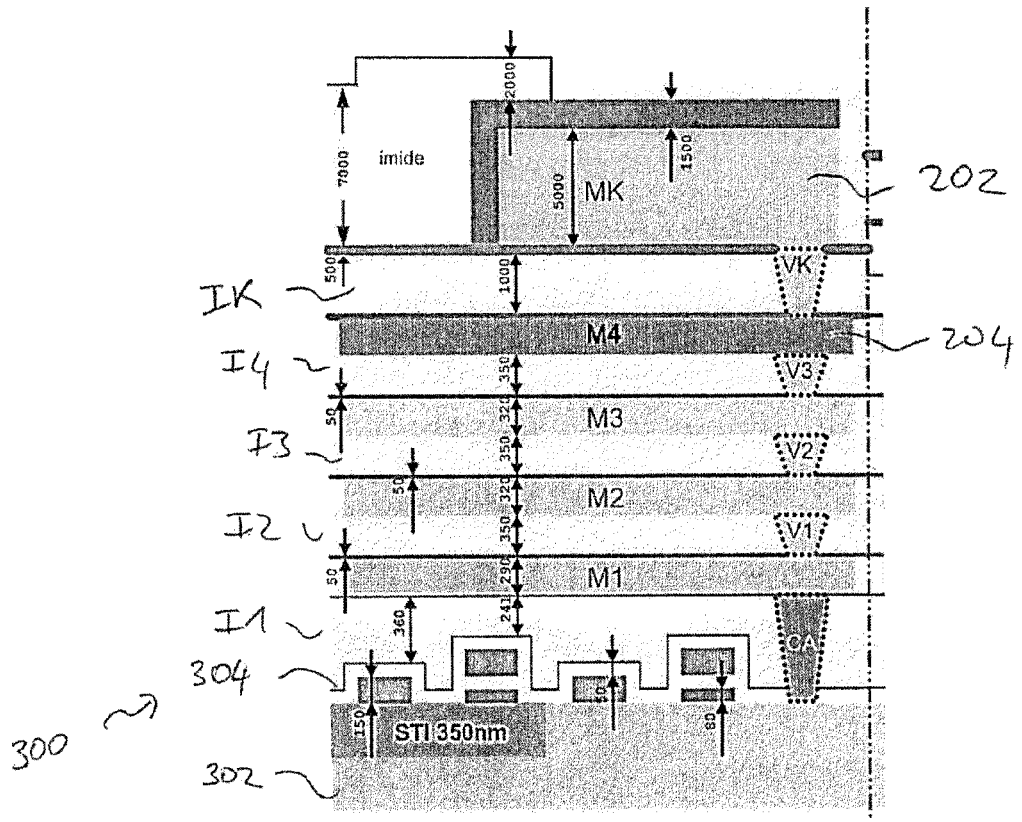
FIG. 3 shows part of a semiconductor chip in accordance with various embodiments.

FIG. 3 shows a portion of a cross section through a semiconductor chip 300 in accordance with various embodiments. The first resistor and the second resistor may be monolithically integrated in the same semiconductor chip. The first resistor and the second resistor may be formed in at least one metallization layer of the semiconductor chip. A metallization layer in which the first resistor is formed and a metallization layer in which the second resistor is formed may be arranged adjacent to each other in one of a vertical and a horizontal manner.

The semiconductor chip 300 illustrated in FIG. 1 may include a semiconductor body 302. At least one power semiconductor component may be integrated in the semiconductor body 302. Such a power semiconductor component may be, for example, any type of controllable semiconductor switches, for example a MOSFET (Metal Oxide Semiconductor Field Effect Transistor), an IGBT (Insulated Gate Bipolar Transistor), a BJT (Bipolar Junction Transistor), a diode, a thyristor, and the like. The semiconductor chip 300 may, for example, be produced using Bipolar CMOS (Complementary Metal Oxide Semiconductor) DMOS (Double Diffused Metal Oxide Semiconductor) (BCD (Bipolar, CMOS, DMOS)) technology.

One or more vertically spaced metallization layers M1, M2, M3, M4 may be arranged on top of an upper surface 304 of the semiconductor body 302. An isolation layer I1 may be arranged between the bottom metallization layer M1 and the upper surface 304 of the semiconductor body 302. Isolation layers I2, I3, and I4 may separate the metallization layers M1, M2, M3 and M4 from each other.

The metallization layers M1, M2, M3, M4 may be structured or patterned so as to connect the power semiconductor component(s) and other components integrated in the semiconductor body 302 in order to form a desired electronic circuit. The metallization layers M1, M2, M3, and M4 may be relatively thin since most of the components integrated in the semiconductor body 302 are low power components and thus the currents flowing through the metallization layers are low. For example, the thickness of the metallization layer M1, M2, M3, or M4 may be below 1000 nm or even below 500 nm. In an exemplary embodiment the metallization layers may have a thickness of 320 nm.

In order to establish an electric contact to the power semiconductor component a top metallization layer MK is provided having a thickness more than 10 times higher (e.g., about 10 to 20 times higher) than the other metallization layers M1 to M4 in order to transport the high currents (up to several amperes) flowing through the power semiconductor component(s) integrated in the semiconductor body 302. For example, the top metallization layer MK may have a thickness higher than the 1000 nm, especially higher than 2500 nm or even higher than 5000 nm. In an exemplary embodiment a top metallization layer has a thickness of 5000 nm. However, the top metallization layer MK may even be thicker dependent on the maximum expected current flow through the power semiconductor component(s).

The circuit components integrated in the semiconductor body 302 may be electrically contacted by means of contacts, for example vias, CA, V1, V2, V3 and VK. The contact CA may provide an electric contact between the bottom metallization layer M1 and the semiconductor body 302 and the contacts V1, V2, and V3 may provide an electric contact or via between the metallization layers M1 to M4. The contact CK may provide an electric contact between the metallization layer M4 and the top metallization layer MK. In order to keep the view simple only one contact CA, V1, V2, V3, VK is shown between each pair of metallization layer. However, a plurality of contacts or vias may be arranged between the layers in order to establish the desired electronic circuitry.

In order to provide information about the load current Iin flowing through the power semiconductor component a part of the thick top metallization layer MK may be structured so as to form a first resistor 202 which may be used as a current measurement resistor or a shunt resistor. The voltage drop across this first resistor 202 may be used as a current sense signal representing the load current Iin through the power semiconductor component. However, the voltage drop across the first resistor 202 does not only depend on the load current Iin flowing through the power semiconductor component, but also on the temperature of first resistor 202. The temperature of first resistor 202 may vary dependent on the current flowing through the first resistor 202.

In order to provide a precise current measurement signal, the component of the current signal (i.e., the voltage drop across the first resistor 202) that is a result of a temperature change relative to an initial temperature (or standard temperature) may be compensated for. For this reason, a second resistor 204 may be used for creating a temperature dependent reference voltage Vref. The second resistor 204 may be formed by a portion of at least one of the thin, vertically spaced metallization layers M1, M2, M3, or M4 which are electrically isolated from the first resistor 202 but thermally coupled thereto such that the first resistor 202 and the second resistor 204 have the same or approximately the same temperature. As the reference current Iref supplied to the second resistor 204 may be much lower than the load current Iin, the second resistor 204 may be formed in one of the thin metallization layers M1 to M4 arranged between the thick top metallization layer MK and the semiconductor surface 304. For example, the second resistor 204 may be formed in one of the thin metallization layers M1 to M4. It may be located adjacent under, for example directly adjacent under, the metallization layer MK in which the first resistor 202 is formed so as to provide a good thermal coupling of the first resistor 202 and the second resistor 204. This may ensure that the temperature of both resistors is practically the same all the time.

The top metallization layer MK may be arranged on the metal layer M4 and separated from it by insulation layer IK which is, for example an oxide layer. The top metallization layer MK is used to establish electric contact with the power semiconductor components integrated in the semiconductor body 302 by means of power via(s) VK. In order to be able to carry the high currents through the power semiconductor components the top metallization layer MK may be rather thick compared to other metallization layers M1 to M4 as already mentioned above.

Figure 4:
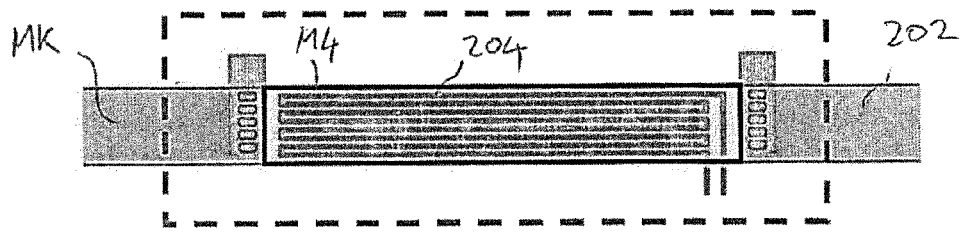
FIG. 4 shows part of a semiconductor chip in accordance with various embodiments.

FIG. 4 shows part of a semiconductor chip in accordance with various embodiments. The part shown may be a top view of the semiconductor chip shown in FIG. 3. It shows a surface of the thick metal layer MK, whereby the thick metal layer MK and the insulation (e.g., oxide) layer IK are interrupted in order to allow a view of the (patterned) metal layer M4 and the second resistor 204 formed in this metal layer. In order to provide a sufficient high resistance the portion of the metal layer M4 forming the second resistor 204 is patterned to form a meander shape as shown in FIG. 4. Alternatively, a spiral shape may be appropriate to achieve the same result. Directly above the second resistor 204 the first resistor 202 may be formed in the thick metal layer MK as a solid rectangular strip line. As both resistors 202, 204 are only separated by insulation layer IK the resistors 202, 204 are thermally coupled and essentially always have the same temperature.

In various embodiments, the first resistor 202 may have a resistance of about 50 milliohms for measuring a maximum load current of about 2.4 amperes. A rectangular portion of the thick metal layer MK may be used to form the resistor, the width W of the rectangular strip line being 30 micrometer and the length L thereof being about 235 micrometer. The second resistor 204 may be formed in a rectangular portion of the same size in the metallization layer M4 directly below the first resistor 202. In order to receive a sufficiently high resistance of, for example, 9.843 ohms a number of, for example, about 75 thin strip lines each having a width of about 0.5 micrometer and a length of about 475 micrometer are connected so as to form a meander shaped strip line as illustrated in FIG. 4.

Figure 5:
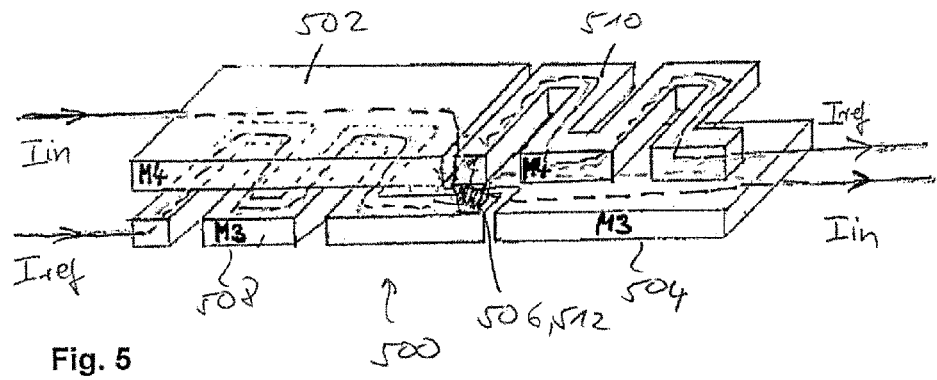
FIG. 5 shows an arrangement of resistors in accordance with various embodiments.

FIG. 5 shows an arrangement of resistors in accordance with various embodiments. The arrangement of resistors may be chosen so that the first resistor and the second resistor are thermally coupled and have the same or approximately the same temperature and have the same or approximately the same temperature dependency of their resistances.

A first portion 502 of the first resistor may be arranged in a first metallization layer M4. A second portion 504 of first resistor may be arranged in a second metallization layer M3. The first portion 502 and the second portion 504 may be connected in series, for example by at least one via 506. The first resistor may be arranged in two different metallization layers, one portion in one metallization layer and another portion in another metallization layer.

A first portion 508 of the second resistor may be arranged in the second metallization layer M3. A second portion 510 of second resistor may be arranged in the first metallization layer M4. The first portion 508 and the second portion 510 may be connected in series, for example by at least one via 512. The second resistor may be arranged in two different metallization layers, one portion in one metallization layer and another portion in another metallization layer.

The portions of the first resistor may have a lower resistance than the portions of the second resistor. The resistance may be reduced by increasing the cross section and reducing the length of the portion through which a current Iin has to flow. The resistance of the portions of the second resistor may be increased by decreasing the cross section and increasing the length of the portion through which a current Iref has to flow. This may be achieved by meandering the portions of the second resistor 204, as is shown in FIG. 5.

The first metallization layer M4 may be arranged adjacent in a vertical manner, that is in a direction perpendicular to a surface of a semiconductor body, to the second metallization layer M3. The first metallization layer M4 and the second metallization layer M3 may have the same thickness. They may be, except for vias connecting first portions and second portions, electrically isolated from each other, for example by an isolation layer, which may for example be an oxide.

The first portion 502 of the first resistor may be arranged adjacent to the first portion 508 of the second resistor in a vertical manner. The first portions 502 and 508 will then have the same or approximately the same temperature. The second portion 504 of the first resistor may be arranged adjacent to the second portion 510 of the second resistor in a vertical manner. The second portions 504 and 510 will then have the same or approximately the same temperature.

The first portion 502 of the first resistor may be arranged adjacent in a horizontal manner, that is in a direction parallel to the surface of the semiconductor body, to the second portion 510 of the second resistor in the same metallization layer. As they are arranged in the same metallization layer they may have the same temperature dependencies or approximately the same temperature dependencies as they may consist of the same material and may be produced by the same production process. The first portion 502 and the second portion 510 may be electrically isolated from each other.

The first portion 508 of the second resistor may be arranged adjacent in a horizontal manner to the second portion 504 of the second resistor in the same metallization layer. As they are arranged in the same metallization layer, they should have the same temperature dependencies or approximately the same temperature dependencies as they may consist of the same material and may be produced by the same production process. The first portion 508 and the second portion 504 may be electrically isolated from each other.

The first resistor and the second resistor may have the same temperature and may have the same temperature dependency of their resistances.

While only two portions of each resistor are shown in FIG. 5, the resistor may be split in more than two portions. For example, a third portion of the first resistor may be arranged in the same metallization layer as the first portion 502 of the first resistor. It may have the same dimensions as the first portion 502 and may be arranged adjacent in a horizontal manner to the second portion 510 of the second resistor. It may be connected in series to the second portion 504 of the first resistor, for example by a least one via. Similarly, a third portion of the second resistor may be arranged in the same metallization layer as the first portion 508 of the second resistor. It may have the same dimensions as the first portion 508 and may be arranged adjacent in a horizontal manner to the second portion 504 of the first resistor. It may be connected in series to the second portion 510 of the second resistor, for example by a least one via. Further portions of the first resistor and the second resistor may be interwoven with each other in a similar manner.

While only two metallization layer M3, M4 are shown in FIG. 5, the principle described above may also be extended to more than two metallization layer. For example, three resistors may be distributed in three metallization layers to obtain the same or approximately the same temperature and the same or approximately the same temperature dependency of their resistances.

Figure 6:
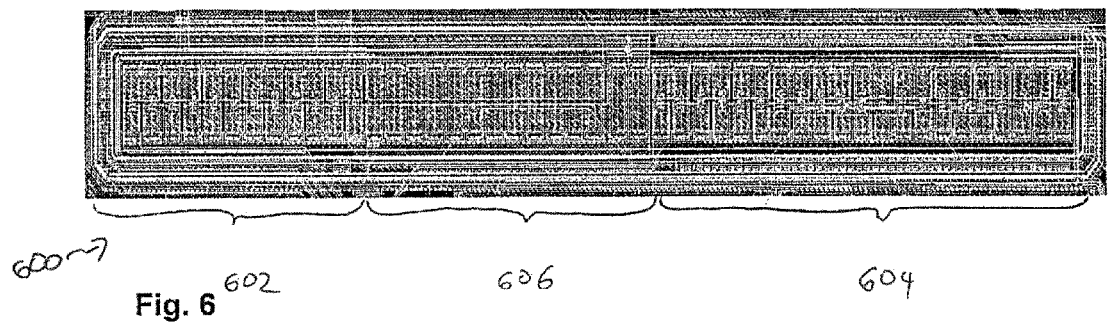
FIG. 6 shows a layout in accordance with various embodiments.
Figure 7:
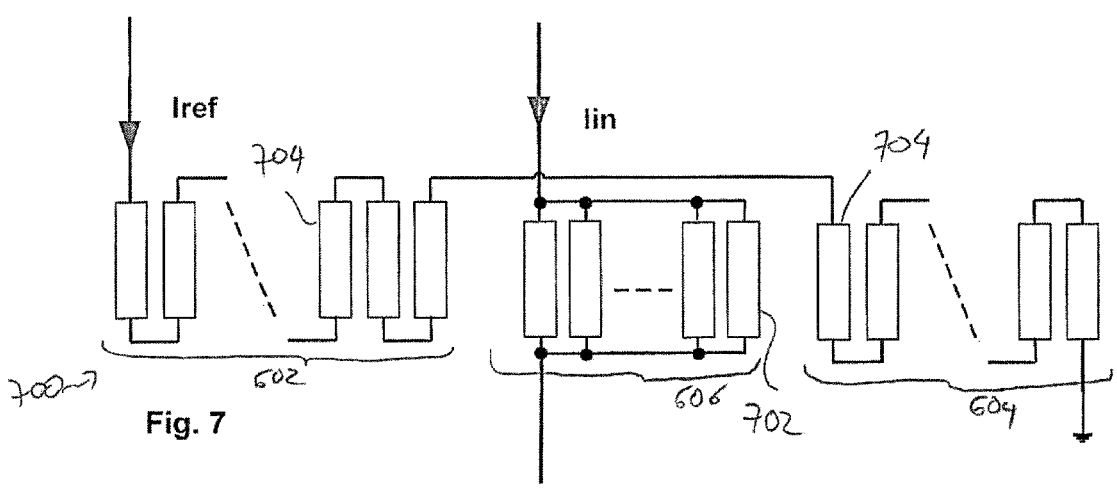
FIG. 7 shows an equivalent circuit in accordance with various embodiments.

FIG. 6 shows a layout 600 in accordance with various embodiments. The layout may comprises a plurality of polysilicon resistors. The polysilicon resistors are arranged so that the resistors are thermally coupled and have the same or approximately the same temperature and the same or approximately the same temperature dependency. The layout is described with the help of FIG. 7, which shows an equivalent circuit 700 in accordance with various embodiments.

The first resistor may include a parallel connection of a plurality of polysilicon resistors. The resistance of the parallel connection may be Rin. The second resistor may include a series connection of a plurality of polysilicon resistors. The resistance of the series connection may be Rref. The polysilicon resistors of the first resistor and the polysilicon resistors of the second resistor may have the same electrical properties and may be produced in the same production process. They may have the same or approximately the same temperature. They may have the same or approximately the same temperature dependency of their resistance.

The plurality of polysilicon resistors of the second resistor may have a first group 602 of polysilicon resistors 704 and a second group 604 of the polysilicon resistors 704. In each group, the resistors 704 may be connected in series with each other. The first group 602 and the second group 604 may a connected in series to each other to form the second resistor with a resistance Rref. At least some of the polysilicon resistors 702 of the first resistor may be arranged between the first group 602 and the second group 604 of the polysilicon resistors 704.

By arranging the polysilicon resistors 702 of the first resistor between the first group 602 and the second group 604 of the polysilicon resistors 704 of the second resistor 204, the temperature of the polysilicon resistors 702 of the first resistor 202 and of the polysilicon resistors 704 of the second resistor 204 may be the same or approximately the same. The polysilicon resistors 702 and the polysilicon resistors 704 may have the same resistance.

Figure 8:
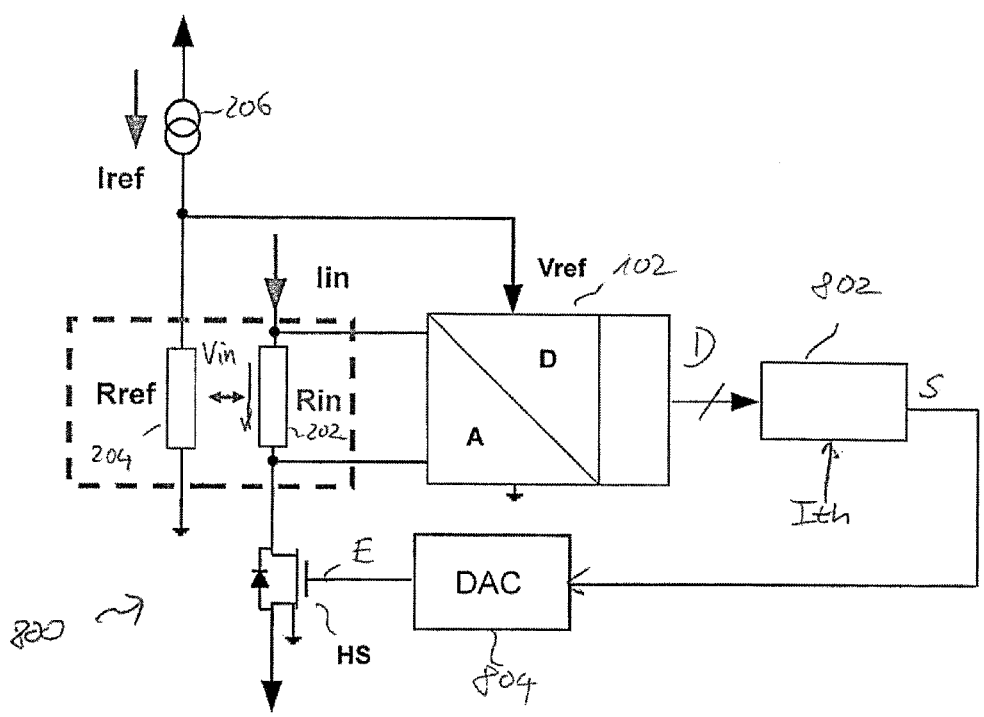
FIG. 8 shows a circuit arrangement in accordance with various embodiments.

FIG. 8 shows a circuit arrangement 800 in accordance with various embodiments. The parts already described in conjunction with the previous figures will not be described again. The principle of operation may be the same as described in conjunction with FIG. 1 and FIG. 2. The first resistor 202 and the second resistor 204 may be the same as described in conjunction with FIG. 3 to FIG. 7. The circuit arrangement 800 may be used to provide a temperature independent current sense signal and to generate an appropriate control signal for driving a power semiconductor component for controlling or regulating the current flow through it.

In order to allow for current measurement the first resistor 202 may be connected in series to the load current path of the power semiconductor component HS which may be, for example, a MOSFET. The second resistor 204 may be provided with a current Iref generated by a constant current source 206. The voltage drop Vin across the first resistor 202 is digitized using the analog-to-digital converter 100 which provides a digital current signal D. The digital current signal D, which represents the load current Iin through the power semiconductor component HS, may be temperature independent or largely temperature independent as both the first resistor 202 and the second resistor 204 may be at the same temperature and may have the same temperature dependency of their resistances and Vin is compared to Vref in the analog-to-digital converter 102.

The load current Iin that flows through the load transistor HS can be controlled by the control loop shown in of FIG. 8. The digital current sense signal D may be fed into a control unit 802 which may generate a digital driver signal S. The digital driver signal S may be fed to the digital-to-analog converter 804. The digital-to-analog converter 804 may provide a corresponding analog driver signal E to a control terminal of the semiconductor component HS thus closing the control loop.

The control law used in the control unit 802 may vary dependent on the actual application. A desired load current Ith may be supplied to the control unit 802 and be processed therein. For current limitation purposes the actual digitized current sense signal D may be compared to the threshold value Ith and the driver signal E may be reduced as soon as the actual load current Iin exceeds the threshold so as to keep the load current Iin below the threshold value. However, different control laws may be applicable dependent on the use of the circuit arrangement.

The current arrangement 800 may be used in a current limiting circuit wherein a current to be limited is measured via the first resistor as the first voltage. A current limiting circuit may for example be used during the ignition of an airbag or for controlling current transients. The current may be cut off when a threshold is exceeded.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a first resistor;
a second resistor thermally coupled to the first resistor;
a current source coupled to the second resistor; and
an analog-to-digital converter configured to receive a first voltage measured via the first resistor as a voltage to be digitized, and to receive a second voltage measured via the second resistor as a reference voltage of the analog-to-digital converter.

2. The circuit arrangement of claim 1,
wherein the first resistor and the second resistor are made of the same material.

3. The circuit arrangement of claim 1,
wherein the first resistor and the second resistor are made of a material selected from a group consisting of:
copper;
polysilicon;
aluminum; and
gold.

4. The circuit arrangement of claim 1,
wherein the first resistor and the second resistor are monolithically integrated in a same semiconductor chip.

5. The circuit arrangement of claim 4,
wherein the first resistor and the second resistor are formed in at least one metallization layer of the semiconductor chip.

6. The circuit arrangement of claim 5,
wherein a metallization layer of the first resistor and a metallization layer of the second resistor are arranged adjacent to each other in one of a vertical and a horizontal manner.

7. The circuit arrangement of claim 6,
wherein the metallization layer of the first resistor has a thickness that is at least 10 times greater than a thickness of the metallization layer of the second resistor.

8. The circuit arrangement of claim 5,
wherein at least a portion of the first resistor is arranged in a first metallization layer and at least another portion of first resistor is arranged in at least a second metallization layer and connected by at least one via to the at least one portion of the first resistor arranged in the first metallization layer; and
at least a portion of the second resistor is arranged in the at least one second metallization layer adjacent to the at least one portion of the first resistor arranged in a first metallization layer and at least another portion of second resistor is arranged in the first metallization layer adjacent to the at least another portion of the first resistor arranged in the at least one second metallization layer and connected by at least one via to the at least one portion of the second resistor arranged in the at least one second metallization layer.

9. The circuit arrangement of claim 8,
wherein the first metallization layer and at least one of the second metallization layer have the same thickness.

10. The circuit arrangement of claim 4,
wherein the first resistor comprises a parallel connection of a plurality of polysilicon resistors and the second resistor comprises a series connection of a plurality of polysilicon resistors.

11. The circuit arrangement of claim 10,
wherein each of the polysilicon resistors of the first resistor and each of the polysilicon resistors of the second resistor have the same resistance.

12. The circuit arrangement of claim 10,
wherein at least some of the polysilicon resistors of the first resistor are arranged between a first group of the polysilicon resistors of the second resistor and a second group of the polysilicon resistors of the second resistor.

13. The circuit arrangement of claim 1,
wherein the resistance of the first resistor is between 10 milliohm and 10 ohm and the resistance of the second resistor is between 100 ohm and 100 kilo ohm.

14. The circuit arrangement of claim 10,
wherein the resistance of the second resistor is greater by at least a factor of 1000 than the resistance of the first resistor.

15. Use of the current arrangement of claim 1 in a current limiting circuit,
wherein a current to be limited is measured via the first resistor as the first voltage.

16. A method for operating an analog-to-digital converter, comprising:
receiving a first voltage by the analog-to-digital converter as a voltage to be digitized;
receiving a second voltage by the analog-to-digital converter as a reference voltage of the analog-to-digital converter;
wherein the first voltage and the second voltage are configured to have the same temperature dependency.

* * * * *